United States Patent
Starostine et al.

(10) Patent No.: US 10,100,404 B2
(45) Date of Patent: Oct. 16, 2018

(54) METHOD AND DEVICE FOR MANUFACTURING A BARRIER LAYER ON A FLEXIBLE SUBSTRATE

(71) Applicant: Fujifilm Manufacturing Europe BV, Tilburg (NL)

(72) Inventors: Serguei Starostine, Tilburg (NL); Hindrik De Vries, Tilburg (NL)

(73) Assignee: Fujifilm Manufacturing Europe BV (NL)

( * ) Notice: Subject to any disclaimer, the term of this patent is extended or adjusted under 35 U.S.C. 154(b) by 550 days.

(21) Appl. No.: 14/407,120

(22) PCT Filed: Jun. 12, 2013

(86) PCT No.: PCT/GB2013/051540
§ 371 (c)(1),
(2) Date: Dec. 11, 2014

(87) PCT Pub. No.: WO2013/190269
PCT Pub. Date: Dec. 27, 2013

(65) Prior Publication Data
US 2015/0184300 A1    Jul. 2, 2015

(30) Foreign Application Priority Data
Jun. 19, 2012 (GB) .................................. 1210836.1

(51) Int. Cl.
| | | |
|---|---|---|
| *C23C 16/40* | (2006.01) | |
| *C23C 16/56* | (2006.01) | |
| *C23C 16/509* | (2006.01) | |
| *H01J 37/32* | (2006.01) | |
| *C23C 16/54* | (2006.01) | |
| *H01L 51/00* | (2006.01) | |

(52) U.S. Cl.
CPC ........ *C23C 16/401* (2013.01); *C23C 16/5093* (2013.01); *C23C 16/5096* (2013.01); *C23C 16/545* (2013.01); *C23C 16/56* (2013.01); *H01J 37/32348* (2013.01); *H01J 37/32825* (2013.01); *H01L 51/0097* (2013.01); *Y02E 10/549* (2013.01); *Y02P 70/521* (2015.11); *Y10T 428/249967* (2015.04)

(58) Field of Classification Search
CPC .............. C23C 16/401; C23C 16/5093; C23C 16/5096; C23C 16/513; C23C 16/545; C23C 16/56; H01J 37/32825; H01J 37/32348; H01L 51/0097; Y02E 10/549; Y02P 70/521; Y10T 428/249967
See application file for complete search history.

(56) References Cited

U.S. PATENT DOCUMENTS

| | | | |
|---|---|---|---|
| 6,774,569 B2 | 8/2004 | de Vries et al. | |
| 7,288,204 B2 | 10/2007 | De Vries et al. | |
| 7,399,944 B2 | 7/2008 | DeVries et al. | |
| 7,491,429 B2 | 2/2009 | De Vries et al. | |
| 7,878,054 B2 * | 2/2011 | Larson ..................... | B64F 5/60 73/150 R |
| 8,323,753 B2 | 12/2012 | De Vries et al. | |
| 2007/0248808 A1 | 10/2007 | Lee et al. | |
| 2008/0193747 A1 | 8/2008 | MacDonald et al. | |
| 2011/0014424 A1 | 1/2011 | De Vries | |
| 2011/0311734 A1 | 12/2011 | De Vries et al. | |
| 2011/0311808 A1 * | 12/2011 | De Vries ............ | C23C 16/0272 428/336 |

FOREIGN PATENT DOCUMENTS

| | | | | |
|---|---|---|---|---|
| EP | 2226832 A1 | 9/2010 | | |
| JP | 2005320583 A | * 11/2005 | | |
| JP | 2007190844 A | 8/2007 | | |
| WO | WO-2010142972 A1 | * 12/2010 | ........... | C23C 16/402 |
| WO | WO-2012-172304 | * 12/2012 | ............. | C23C 16/40 |

OTHER PUBLICATIONS

Database WPI, Week 200763, Thomson Scientific, London [GB]; AN 2007-669624 & JP 2007 190844 A (Konica Corp) Aug. 2, 2007 (Aug. 2, 2007).
Maechler L. et al., "Anti-Fog Layer Deposition onto Polymer Materials: A Multi-Step Approach", Plasma Chemistry and Plasma Processing, vol. 31, No. 1, Dec. 23, 2010 (Dec. 23, 2010), pp. 175-187, XP019874833, Springer International Publishing AG, Cham [CH] ISSN: 1572-8986, DOI: 10.1007/S11090-010-9261-4.
International Preliminary Report on Patentability dated Dec. 23, 2014, issued from corresponding PCT/GB2013/051540.

\* cited by examiner

Primary Examiner — Laura Edwards
Assistant Examiner — Jose Hernandez-Diaz
(74) Attorney, Agent, or Firm — Banner & Witcoff, Ltd.

(57) ABSTRACT

Method and apparatus for manufacturing a barrier layer on a substrate (1; 1a, 1b). An inorganic oxide layer (11) having a pore volume between 0.3 and 10 vol. % is provided on the substrate (1; 1a, 1b). Subsequently the substrate (1; 1a, 1b) with the inorganic oxide layer (11) is treated in an atmospheric glow discharge plasma to form a sealing layer (12), the plasma being generated by at least two electrodes (2, 3) in a treatment space (5) formed between the at least two electrodes (2, 3). The treatment space (5) comprises in operation a mixture of a gas comprising oxygen and precursor material in an amount between 2 and 50 ppm. A local deposition rate is controlled at 5 nm/sec or lower, using a power density of 10 W/cm$^2$ or higher in the treatment space (5).

13 Claims, 2 Drawing Sheets

METHOD AND DEVICE FOR MANUFACTURING A BARRIER LAYER ON A FLEXIBLE SUBSTRATE

RELATED APPLICATION DATA

Figure 1A:
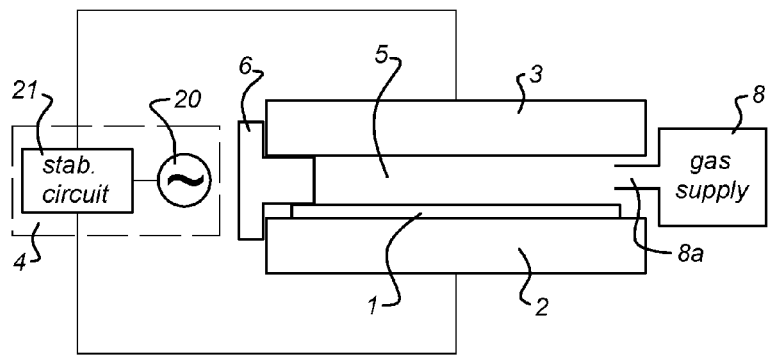

This application is a National Stage Application under 35 U.S.C. 371 of co-pending PCT application PCT/GB2013/051540 designating the United States and filed Jun. 12, 2013; which claims the benefit of GB application number 1210836.1 and filed Jun. 19, 2012 each of which are hereby incorporated by reference in their entireties.

TECHNICAL FIELD

The invention relates to a method for manufacturing a barrier layer on a substrate. The present invention further relates to a device for manufacturing such a barrier layer. In addition the invention relates to a substrate having a silicon oxide barrier layer.

BACKGROUND

The present invention is amongst others applicable to the enveloping and/or supporting substrate of an electronic device comprising a conductive polymer with e.g. an electronic device, a photovoltaic cell and/or semi-conductor devices.

Optical glass has been previously used in electronic display applications as substrate because it is able to meet the optical and flatness requirements and has thermal and chemical resistance and good barrier properties. Main disadvantage of the use of glass is related to its weight, inflexibility and fragility. For this reason flexible plastic materials have been proposed as replacement for glass.

Disadvantages of the use of polymeric substrates are their lower chemical resistance and inferior barrier properties.

It is a known fact, that atmospheric pressure glow discharge plasmas used for deposition of a chemical compound or chemical element suffer from dust formation by which formation of a smooth surface cannot be obtained and the used equipment will accumulate the dust in a short period of time resulting in products with worse barrier properties as the roughness of the barrier layer.

In the article "Deposition of dual-layer of $SiO_x/SiO_xC_yN_wH_z$ by Townsend dielectric barrier discharge" by Maechler et al. it is described that a dual layer barrier is formed on a polymer substrate. The method uses an atmospheric pressure Townsend discharge mode (different from Glow discharge mode) in a treatment space. A first (shield) layer is deposited of organic material $SiO_xC_yN_wH_z$ after which a $SiO_x$ barrier layer is deposited. The article also discloses that a $SiO_x$ coating directly deposited on a polymer in the atmospheric pressure Townsend discharge plasma induces damages of the polymer resulting in poorer barrier properties than for uncoated polymer. The best result reported to be achieved is a 10-fold improvement of the barrier properties (Barrier Improvement Factor BIF=10).

In the international patent application WO2007139379, filed by applicant, the process is described for depositing inorganic layers on substrates using a predefined $t_{on}$ time and a predefined gas-composition for preventing the formation of dust in the treatment space.

Further WO2006097733 describes a method of making a composite film with a barrier by applying a planarising coating composition first and then providing a barrier film by high-energy vapour deposition.

WO2010092383 and WO2010092384, both filed by applicant, describe processes of a two layer deposition on a polymer substrate using an atmospheric pressure glow discharge plasma in a treatment space formed between two or more opposing electrodes connected to a power supply using a conditioned gas composition in the treatment space comprising a precursor and oxygen. In both processes the second layer of inorganic material is deposited on the first layer in a treatment space wherein the oxygen has a concentration of 3% or higher, and the power supply is controlled to provide an energy across a gap between the two or more opposing electrodes of 40 $J/cm^2$ or higher.

In many manufacturing processes involving glass substrates, such as the process of manufacturing OLED devices, there is a desire to replace glass substrates with low weight, flexible polymeric substrates using polymers with a very thin amorphous layer of metal oxide with improved barrier properties.

It is an object of the invention to provide a method for creating an improved barrier on a substrate, in particular a flexible substrate.

SUMMARY OF THE INVENTION

According to a present invention embodiment, a method is provided for manufacturing a (silicon oxide) barrier layer on a substrate, the method comprising:
providing an inorganic oxide layer having a pore volume between 0.3 and 10 vol. % on the substrate; and
subsequently treating the substrate with the inorganic oxide layer in an atmospheric glow discharge plasma to form a sealing layer, the plasma being generated by at least two electrodes in a treatment space formed between the at least two electrodes, the treatment space comprising in operation a mixture of a gas comprising oxygen and precursor material in an amount between 2 and 50 ppm, by controlling a local deposition rate at 5 nm/sec or lower, using a power density of 10 $W/cm^2$ or higher in the treatment space.

In this respect, pore volume is expressed in volume percentage, and is the ratio of open spaces in a layer and the volume of solid material in the layer. The free pore volume of a layer of inorganic oxide may be determined using the Lorentz-Lorenz equations by measuring the optical density difference of the material.

A gas comprising oxygen is to be understood as a mixture of gases, in which one or more of the gases comprise oxygen atoms as a reactive component, e.g. $O_2$.

In another embodiment the treatment of the substrate with the inorganic oxide layer in the treatment space is done at a temperature below 150° C., e.g. below 100° C.

In another embodiment, the treatment of the substrate with the organic oxide layer in the treatment space is done during a time period of less than 20 minutes, e.g. less than 10 minutes. Given the conditions outlined above, this is enough time to form a suitable sealing layer as part of a barrier layer on a substrate.

In an embodiment, the substrate is a flexible substrate, in particular a flexible polymeric substrate, such as polyethylene terephthalate (PET) or polyethylene naphthalate (PEN). In a further embodiment, the electrodes are roll-electrodes, and the flexible layer is moved through the treatment space at a linear speed.

In another embodiment the gas composition may comprise other inert gasses like Argon or Helium.

In an embodiment the generated plasma is a high frequency or radio frequency (RF) plasma or discharge.

In an embodiment, the sealing layer of the barrier that is formed is between 2 and 15 nm, e.g. between 7 and 12 nm, thick.

In an embodiment, the provided inorganic oxide layer that is formed is between 10 and 100 nm, e.g. between 20 and 80 nm, thick and may be 50 nm.

In an embodiment the inorganic layer is provided on the substrate using an atmospheric glow discharge plasma, said plasma being generated by at least two electrodes in a treatment space formed between the at least two electrodes, the treatment space comprising in operation a gas comprising oxygen and a precursor material.

In a further embodiment the first deposition step is done in a treatment space with a controlled oxygen concentration above 5%, i.e. 10% or 15% or even 21%. In a further embodiment the precursor amount of the first deposition step is much higher versus the second step and in is the range of 250 to 5000 ppm to enable a fast deposited inorganic oxide layer.

As a result of the treatment the first layer deposited inorganic oxide layer becomes sealed after a small second step deposition under the controlled condition of precursor and local deposition rate and power density, which was an unforeseen and surprising effect.

Exemplary precursor materials for the first and/or second step (forming of inorganic layer, and sealing layer, respectively) are TEOS (tetraethoxysilane), HMDSO (hexamethyldisiloxane), HMDSN (hexamethyldisilazane), TMDSO (tetramethyldisiloxane), TMCTS (tetramethylcyclotetrasiloxane). One precursor material used with specific advantage is TEOS in concentration of 2 to 50 ppm, e.g. between 5 and 25 ppm.

The flexible substrate may be any kind of polymeric film. In an exemplary embodiment polyethylene terephthalate (PET) or polyethylene naphthalate (PEN) film is used having a thickness of 50 to 200 μm.

Other examples of substrate which may be used are transparent sheets of ethylene vinyl acetate (EVA), of polyvinyl butyral (PVB), of polytetrafluoroethylene (PTFE), perfluoroalcoxy resins (PFA), i.e., copolymers of tetrafluoroethylene and perfluoroalkyl vinyl ether, tetafluoroethylene-hexafluoropropylene copolymers (FEP), tetrafluoroethylene-perfluoroalkyl vinyl ether-hexafluoro-propylene copolymers (EPE), tetrafluoroethylene-ethylene or propylenecopolymers (ETFE), polychlorotrifluoroethylene resins (PCTFE), ethylene-chlorotrifluoroethylene copolymers (ECTFE), vinylidene fluoride resins (PVDF), and polyvinyl fluorides (PVF) or coextruded sheets from polyester with EVA, polycarbonate, polyolefin, polyurethane, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate.

A further aspect of the present invention relates to an apparatus for manufacturing a barrier layer on a substrate, the apparatus comprising an atmospheric pressure glow discharge (APGD) plasma apparatus comprising at least two electrodes arranged to generate an atmospheric pressure glow discharge plasma in a treatment space formed between said two electrodes, a control unit connected to the at least two electrodes, and a gas supply unit in communication with the treatment space, the control unit and gas supply being arranged to provide an inorganic oxide layer having a pore volume between 0.3 and 10 vol. % on the substrate, and subsequently treating the substrate with the inorganic oxide layer to form a sealing layer, the treatment space comprising in operation a mixture of a gas comprising oxygen and precursor material in an amount between 2 and 50 ppm, by controlling a local deposition rate at 5 nm/sec or lower, using a power density of 10 W/cm$^2$ or higher in the treatment space.

In a further embodiment, the control unit and gas supply are arranged to execute the method according to any one of the embodiments described above.

In an even further aspect, the present invention relates to a flexible substrate composition comprising a substrate, an inorganic layer having a pore volume between 0.3 and 10 vol. %, and a sealing layer manufactured according to any one of the associated method embodiments. The inorganic layer is manufactured in a further embodiment according to any one of the further associated method embodiments.

SHORT DESCRIPTION OF THE FIGURES

Figure 1B:
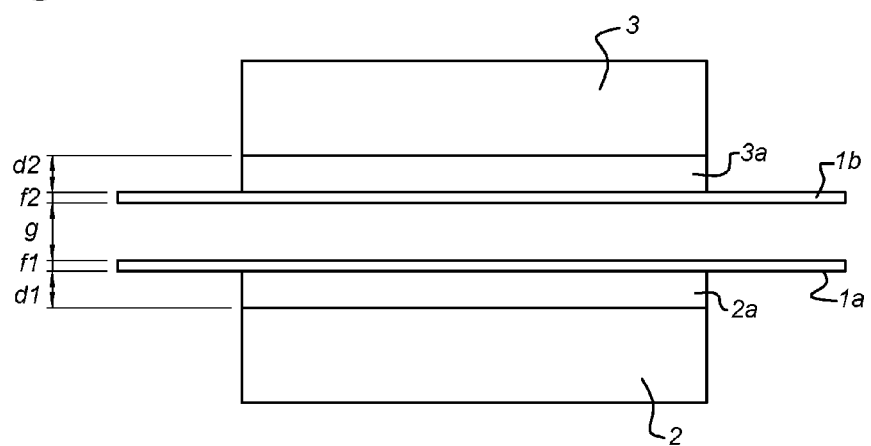
Figure 1C:
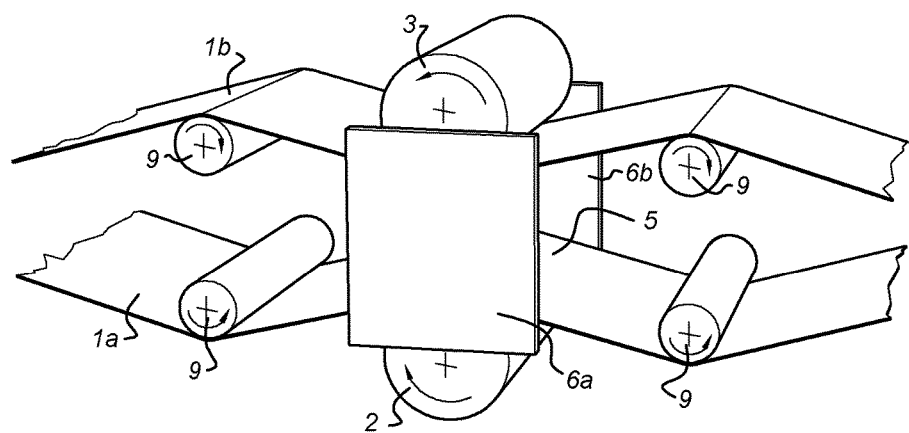

The present invention will be discussed in more detail below, using a number of exemplary embodiments, with reference to the attached drawings, in which FIGS. 1a, 1b, and 1c show schematic views of a plasma generation device according the invention.

Figure 2:
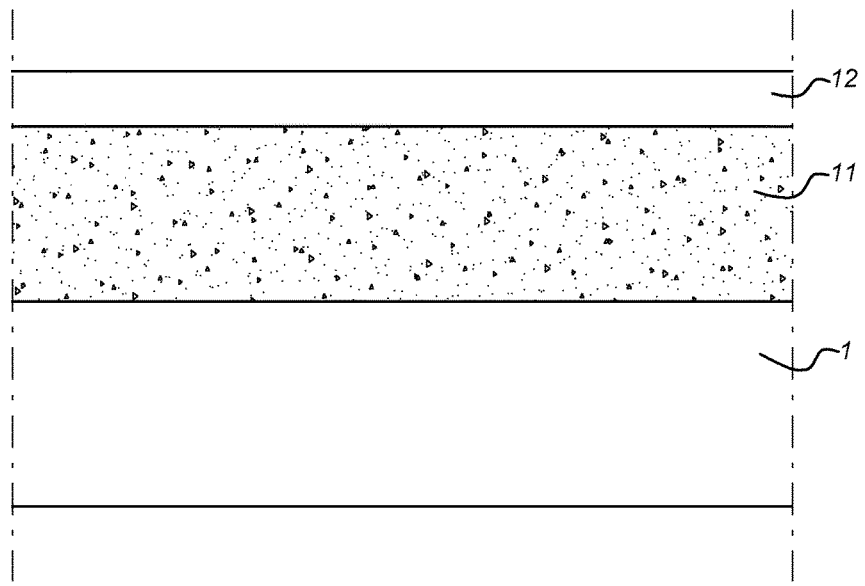

FIG. 2 shows a cross sectional view of a substrate treated in accordance with one of the present invention embodiments.

DETAILED DESCRIPTION OF THE EXAMPLES

The present invention will now be described in reference to exemplary embodiments of the invention.

FIG. 1a shows a schematic view of a plasma apparatus with which the present invention may be practiced. A treatment space 5, which may be a treatment chamber within an enclosure (not shown in FIG. 1a), or a treatment space 5 with an open structure, comprises two electrodes 2, 3. In general the electrodes 2, 3 are provided with a dielectric barrier 2a, 3a (see FIG. 1b) in order to be able to generate and sustain a glow discharge at atmospheric pressure in the treatment space. In the embodiment shown, the electrodes 2, 3 are planar electrodes, and the treatment space 5 is a rectangular space. A side tab 6 is provided to close off the treatment space 5 on one side.

However, other forms of the electrodes 2, 3 and of the gap or treatment space 5 are possible, e.g. as part of a cylindrical arrangement of the plasma treatment apparatus. E.g., the treatment space may be cylindrical, or elliptic, or have another form adapted to treat a specific type of substrate 1. Both electrodes 2, 3 may have the same configuration being flat orientated (as shown in FIGS. 1a) or both being roll-electrodes (as shown in FIG. 1c). Also different configurations may be applied using a roll electrode and a flat or cylinder segment shaped electrode opposing each other. In further embodiments, the electrodes may be multi-segment electrodes. Embodiments using more than two electrodes are also imaginable.

In general the atmospheric pressure plasma is generated between the two electrodes 2, 3 in the treatment space 5. Alternatively a plurality of electrodes 2, 3 is provided. In case the electrodes 2, 3 have a surface area which is at least as big as the substrate 1, the substrate 1 can be fixed in the treatment space 5 between the two electrodes 2, 3.

FIG. 1b shows a variant wherein two substrates 1a, 1b are treated simultaneously. In this alternative embodiment, not one substrate 1 but two substrates (1a, 1b) are positioned in a fixed way or moving at a certain speed in the treatment space 5 to utilise the gas and energy supply even more efficiently. In FIG. 1c a further example of such an embodiment comprising two side tabs 6a, 6b and two substrates 1a, 1b is shown.

Both electrodes 2, 3 can be provided with a dielectric barrier layer 2a, 3a (see FIG. 1b). The dielectric layer 2a on the first electrode 2 has a thickness of d1 (mm), and the dielectric layer 3a on the second electrode 3 has a thickness of d2 (mm). In operation, the total dielectric distance d of the electrode configuration also includes the thickness of the (one or two) substrates 1a, 1b to be treated, indicated by f1 (mm) and f2 (mm). Thus, the total dielectric thickness of the dielectric barrier in the treatment space 5 between the at least two opposing electrodes (2, 3) equals d=d1+f1+f2+d2.

In a further embodiment, both d1 and d2 are 0 and the only dielectric material forming the dielectric barrier is the substrate 1a, 1b. In case of two substrates 1a and 1b, the total dielectric thickness in this case is d=f1+f2.

In still another embodiment both d1 and d2 are 0 and only one substrate 1 is used. In this embodiment the total dielectric thickness equals f1, so d=f1. Also in this embodiment in which electrode 3 is not covered with a dielectric material it is possible to obtain a stable atmospheric glow discharge plasma. The gap distance g in FIG. 1b indicates the smallest gap between the electrodes 2, 3 where an atmospheric pressure glow discharge plasma can exist in operation (i.e. in the treatment space 5), also called the free inter-electrode space. The dimensions of the electrodes 2, 3, dielectric barrier layers 2a, 3a, and gap g between the electrodes 2, 3, are predetermined in order to generate and sustain a glow discharge plasma at atmospheric pressure in the treatment space 5.

The dimensions of the electrodes 2, 3, dielectric barrier layers 2a, 3a, and gap g between the electrodes 2, 3 and the total dielectric distance (d) which is the total dielectric thickness of the dielectric barrier are controlled in a further embodiment, such that the product of gap distance and the total dielectric distance is arranged to be less than or equal to 1.0 $mm^2$ or even more preferred less than 0.5 $mm^2$ as disclosed in WO 2009/104 957 by applicant and is hereby incorporated by reference.

In case the substrate 1 is larger than the electrode area, the substrate 1 may be moved through the treatment space 5, e.g. at a linear speed using a roll-to-roll configuration, an example of which is shown in the embodiment of FIG. 1c. The substrates 1a, 1b are guided in close contact with the roller shaped (roll) electrodes 2, 3, using guiding rollers 9. A roll-electrode is e.g. implemented as a cylinder shaped electrode, mounted to allow rotation in operation e.g. using a mounting shaft or bearings. Such a roll-electrode may be freely rotating, or may be driven at a certain angular speed, e.g. using well known controller and drive units. The side tabs 6a, 6b are positioned at the roller end faces, thereby creating a closed off treatment space 5 between the electrodes 2, 3.

The electrodes 2, 3 are connected to a power supply 4, which is arranged to provide electrical power to the electrodes for generating the atmospheric (glow discharge) plasma.

The power supply can be a power supply providing a wide range of frequencies for example f=10 kHz-30MHz.

Very good results can be obtained by using an atmospheric pressure glow discharge (APGD) plasma. Until recently these plasma's suffered from a bad stability, but using the stabilization circuits as for example described in U.S. Pat. No. 6,774,569, EP1383359, EP1547123 and EP1626613 (which are incorporated herein by reference), very stable APG plasma's can be obtained. In general these plasma's are stabilized by a stabilization circuit 21 (as shown FIG. 1a) counteracting local instabilities in the plasma. Using the stabilization circuit 21 in combination with the AC power source 20 in the power supply 4 for the plasma generating apparatus results in a controlled and stable plasma, without streamers, filamentary discharges or other imperfections.

In the plasma treatment apparatus a gas supply device 8 may be arranged for the substrate treatment in order to direct the gas for the deposition steps towards an inner region of the substrate to be processed. The supply device 8 also acts as the main carrier gas supply. In the treatment space 5, oxygen gas and optional other gasses are introduces using the gas supply device 8 including a precursor. A carrier gas may be used such as Argon, Helium, etc., to form the plasma, as an additive or mixture to reduce the breakdown voltage.

A gas supply inlet 8a may be used to direct the gas into the treatment space 5 as is shown in EP 2 226 832 by applicant and hereby incorporated as reference. The gas supply device 8 may be provided with storage, supply and mixing components as known to the skilled person. The purpose is to have the precursor decomposed in the treatment space 5 to a chemical compound or chemical element which is deposited on the substrates 1, 1a, 1b.

Surprisingly it has been found that substrates 1, 1a, 1b can be made having excellent barrier properties after deposition of two layers. This is accomplished in one embodiment by a fast deposition of inorganic oxide by using a gas composition comprising oxygen and a precursor in a treatment space 5 and by depositing as second step a very thin layer of silicon oxide by controlling in the treatment space the precursor in an amount between 2 and 50 ppm and at a controlled local deposition rate of 5 nm/sec or lower at a power density of 10 $W/cm^2$ or higher.

The deposition of the first layer does not result in a substrate producing any significant barrier property improvement compared to the barrier property of the polymeric substrate alone. When in addition a second thin layer deposition between 2 and 20 nm, (e.g. 7 nm thick) is applied controlling the oxygen and precursor in an amount between 2 and 50 ppm and at a controlled local deposition rate of 5 nm/sec on the total treated substrate surface in the treatment space or lower than 5 nm/sec at a controlled power density of 10 $W/cm^2$ or higher a substrate can be obtained having excellent barrier properties.

In a further embodiment the power supply for the second step deposition is in the range of 600 to 1200 W, e.g. between 700 and 1000 W, i.e. for instance 900 W.

To control the local deposition rate several (external) parameters are relevant as they interact in a complex way. The deposition of the precursor species is controlled by diffusion of the precursor fragments to the surface, while the average plasma power, controlled by excitation frequency voltage amplitude and duty cycle, has a strong effect on the dissociation rate of the precursors. Also the level of the atomic oxygen is very important in the local deposition rate. To assure that the local deposition does not exceed a threshold value of 5 nm/s the gas flow and the overall gap distance which is governed by the electrode geometry should be adjusted in such a way that the velocity of the gas species in the gas flow direction is sufficiently high to control the local diffusion of the depositing species to the surface. All the above mentioned parameters effect the local deposition rate and thus have a strong impact on the barrier-ability of the present process embodiments.

In further embodiment the first deposition step is done very fast in between 1 second and 5 minutes.

In another embodiment the first step is done by controlling the oxygen concentration above 5% (i.e. 10% or 15% or even 21%) and by using a high precursor amount of 250 to 5000 ppm in the treatment space 5.

As a result of these actions a very quick deposition is done of the first inorganic oxide layer. Further it may result in a first layer having in practical no improved WVTR property compared to the polymer substrate and may have a pore volume between 0.3 and 10 vol. %.

In a further embodiment the gas composition for the first deposition may comprise besides the mentioned oxygen and the precursor other containing gas compounds such as $N_2$ (nitrogen) only but may comprise also $NH_3$ (ammonia) and or combinations thereof. In a preferred embodiment the preferred condition may comprise oxygen, precursor and nitrogen only.

The total amount of gas supplied to the substrate in the treatment space for both steps is in the range of 30 to 100 slm.

Further the temperature in the treatment space 5 during both steps step is below 150° C., e.g. below 100° C., e.g. 80° C.; the time of plasma treatment in both deposition steps is below the 20 minutes, e.g. below 5 and even possibly below 2 minutes. Excellent results have been found using at most 60 seconds of plasma treatment. As a result excellent barriers can be prepared at very mild conditions i.e. at atmospheric pressure at low temperature and high speed giving high economical value.

EXAMPLES

WVTR is determined using a Mocon Aquatran Model 1 which uses a coloumetric cell (electrochemical cell) with an minimum detection limit of $5*10^{-4}$ $g/m^2*day$. This method provides a more sensitive and accurate permeability evaluation than the permeation measurement by using IR absorption. All measurements were done at 40° C./90% RH.

The free pore volume of the inorganic oxides was determined using the Lorentz-Lorenz equations by measuring the optical density difference of the material. Optical density difference was measured using a Woollam Spectroscopic Ellipsometer equipped with a vacuum chamber and heating stage.

Several samples (rolls) were prepared by depositing a layer on a substrate of polyethylene naphthalate (PEN) (100 μm thick) or polyethylene terephthalate (PET) (100 μm thick) using an atmospheric pressure glow discharge plasma apparatus as e.g. disclosed in WO2009104957 in a treatment space using a plasma power of 600 W, an excitation frequency of 200 kHz and a gas composition (85% $N_2$/15% $O_2$) using different precursors 2500 ppm (HMDSO/TEOS/HMDSN) at a power density of 15 $W/cm^2$ resulting in the following examples all having 70 nm silicon oxide layer.

TABLE 1

| Step 1 | Substrate | Precursor | Pore volume (vol. %) |
|---|---|---|---|
| Layer 1 | polyethylene naphthalate (PEN) | TEOS | 0.3~3 |
| Layer 2 | polyethylene terephthalate (PET) | HMDSO | 0.3~3 |

TABLE 1-continued

| Step 1 | Substrate | Precursor | Pore volume (vol. %) |
|---|---|---|---|
| Layer 3 | polyethylene terephthalate (PET) | HMDSN | 0.3~3 |

Typical WVTR of the PET samples after deposition is 5 $g/m^2*day$ and for polyethylene naphthalate (PEN) the WVTR is 2 $g/m^2*day$. These WVTR values are similar to the values of the bare polymer film.

As next step the examples were treated in a second step using the same atmospheric pressure plasma unit using a varying plasma power (in $W/cm^2$ as described in Table 2) an excitation frequency of 200 kHz and a gas composition (85% $N_2$/15% $O_2$) and a varying precursor amount and varying local deposition rates as described in Table 2. The second step resulted in an extra deposition of silicon oxide layer with a thickness between 1 and 15 nm, i.e. 2, 3, 4, 5, 6, 7, 8, 9, 10, 11, 12, 13 nm thick.

TABLE 2

| step 1 layer (see table 1) | Precursor amount (ppm) | Power density (W/cm²) | Local Deposition rate (nm/sec) | Comp./ Invention | WVTR (g/m² * day) |
|---|---|---|---|---|---|
| 1 | 1 | 2500 | 40 | 25 | C | 2 |
| 2 | 1 | 12 | 10 | 10 | C | 2 |
| 3 | 1 | 20 | 15 | 2.3 | I | $1.4 * 10^{-3}$ |
| 4 | 1 | 12 | 20 | 1.3 | I | $1.0 * 10^{-3}$ |
| 5 | 1 | 25 | 20 | 3 | I | $1.2 * 10^{-3}$ |
| 6 | 1 | 30 | 25 | 3.6 | I | $2.1 * 10^{-3}$ |
| 7 | 1 | 35 | 25 | 4.6 | I | $1.6 * 10^{-3}$ |
| 8 | 1 | 40 | 25 | 5.5 | I | $1.0 * 10^{-1}$ |
| 9 | 2 | 12 | 20 | 3.2 | I | $1.4 * 10^{-3}$ |
| 10 | 2 | 15 | 25 | 3.5 | I | $1.9 * 10^{-3}$ |
| 11 | 2 | 17 | 25 | 4.6 | I | $1.5 * 10^{-3}$ |
| 12 | 2 | 20 | 25 | 5.5 | I | $5.2 * 10^{-2}$ |
| 13 | 3 | 12 | 20 | 2.5 | I | $1.1 * 10^{-3}$ |
| 14 | 3 | 15 | 25 | 3.3 | I | $4.4 * 10^{-3}$ |
| 15 | 3 | 17 | 25 | 4.5 | I | $3.5 * 10^{-3}$ |
| 16 | 3 | 20 | 25 | 5.2 | I | $2.1 * 10^{-2}$ |

The invention claimed is:

1. A method for manufacturing a barrier layer on a substrate, the method comprising:
   providing an inorganic oxide layer having a pore volume between 0.3 and 10 vol. % on the substrate; and
   subsequently treating the substrate with the inorganic oxide layer in an atmospheric glow discharge plasma to form a silicon dioxide sealing layer with a thickness between 1 and 15nm, the plasma being generated by at least two electrodes in a treatment space formed between the at least two electrodes, the treatment space comprising in operation a mixture of a gas comprising oxygen and precursor material in an amount between 2 and 50 ppm, by controlling a local deposition rate at 5.5 nm/sec or lower, using a power density of 10 $W/cm^2$ or higher in the treatment space, wherein the precursor material comprises tetraethoxysilane, hexamethyldisiloxane and/or hexamethyldisilazane.

2. The method according to claim 1, wherein the treatment of the substrate with the inorganic oxide layer in the treatment space is done at a temperature below 150 ° C.

3. The method according to claim 1, wherein the treatment of the substrate with the inorganic oxide layer in the treatment space is done during a time period of less than 20 minutes.

4. The method according to claim 1, wherein the substrate is a flexible polymeric substrate.

5. The method according to claim 1, wherein the inorganic oxide layer is provided on the substrate using an atmospheric glow discharge plasma, said plasma being generated by at least two electrodes in a treatment space formed between the at least two electrodes, the treatment space comprising in operation a gas comprising oxygen and a precursor material.

6. The method according to claim 5, wherein the inorganic oxide layer has a pore volume between 0.3 and 3 vol. %.

7. The method according to claim 5, wherein the provision of the inorganic oxide layer on the substrate is done in a time period of less than 20 minutes.

8. The method according to claim 5, wherein the gas used to provide the inorganic oxide layer comprises oxygen in a concentration above 5% and a precursor material amount between 250 and 5000 ppm.

9. The method according to claim 5, wherein the provision of the inorganic oxide layer in the treatment space is done at a temperature below 150 ° C.

10. The method according to claim 1, wherein:
(a) the treatment of the substrate with the inorganic oxide layer in the treatment space is done at a temperature below 150 ° C.;
(b) the treatment of the substrate with the inorganic oxide layer in the treatment space is done during a time period of less than 20 minutes; and
(c) the substrate is a flexible polymeric substrate.

11. The method according to claim 1, wherein:
(a) the treatment of the substrate with the inorganic oxide layer in the treatment space is done at a temperature below 100 ° C.;
(b) the treatment of the substrate with the inorganic oxide layer in the treatment space is done during a time period of less than 20 minutes; and
(c) the substrate is a flexible polymeric substrate selected from the group consisting of polyethylene terephthalate and polyethylene naphthalate.

12. The method according to claim 5, wherein:
(a) the inorganic oxide layer has a pore volume between 0.3 and 3 vol. %;
(b) the provision of the inorganic oxide layer on the substrate is done in a time period of less than 20 minutes;
(c) the gas used to provide the inorganic oxide layer comprises oxygen in a concentration above 5% and a precursor material amount between 250 and 5000 ppm; and
(d) the provision of the inorganic oxide layer in the treatment space is done at a temperature below 150 ° C.

13. The method according to claim 1, wherein:
(a) the treatment of the substrate with the inorganic oxide layer in the treatment space is done at a temperature below 100 ° C.;
(b) the treatment of the substrate with the inorganic oxide layer in the treatment space is done during a time period of less than 20 minutes;
(c) the substrate is a flexible polymeric substrate selected from the group consisting of polyethylene terephthalate and polyethylene naphthalate;
(d) the inorganic oxide layer is provided on the substrate using an atmospheric glow discharge plasma, said plasma being generated by at least two electrodes in a treatment space formed between the at least two electrodes, the treatment space comprising in operation a gas comprising oxygen and a precursor material;
(e) the inorganic oxide layer has a pore volume between 0.3 and 3 vol. %;
(f) the gas used to provide the inorganic oxide layer comprises oxygen in a concentration above 5% and a precursor material amount between 250 and 5000 ppm; and
(g) the provision of the inorganic oxide layer in the treatment space is done at a temperature below 150 ° C.

* * * * *